(12) United States Patent
Loewenstein

(10) Patent No.: US 8,812,935 B2
(45) Date of Patent: Aug. 19, 2014

(54) USING A DATA ECC TO DETECT ADDRESS CORRUPTION

(75) Inventor: Paul N. Loewenstein, Palo Alto, CA (US)

(73) Assignee: Oracle International Corporation, Redwood Shores, CA (US)

( * ) Notice: Subject to any disclaimer, the term of this patent is extended or adjusted under 35 U.S.C. 154(b) by 114 days.

(21) Appl. No.: 13/565,430

(22) Filed: Aug. 2, 2012

(65) Prior Publication Data

US 2014/0040697 A1 Feb. 6, 2014

(51) Int. Cl.
- *G11C 29/00* (2006.01)
- *H03M 13/00* (2006.01)
- *G06F 11/10* (2006.01)
- *H03M 13/05* (2006.01)

(52) U.S. Cl.
CPC ........ *G06F 11/1008* (2013.01); *G06F 11/1016* (2013.01); *G06F 11/1068* (2013.01); *G06F 11/102* (2013.01); *H03M 13/05* (2013.01)
USPC ............................ 714/768; 714/773; 714/758

(58) Field of Classification Search
CPC ............ G06F 11/1016; G06F 11/1064; G06F 11/1008; G06F 11/1068; G06F 11/102; H03M 13/05
USPC .......................................... 714/758, 768, 773
See application file for complete search history.

(56) References Cited

U.S. PATENT DOCUMENTS

| | | | |
|---|---|---|---|
| 5,872,790 A | 2/1999 | Dixon | |
| 7,085,988 B1 | 8/2006 | Weng | |
| 7,188,296 B1 | 3/2007 | Cypher | |
| 7,382,876 B2 | 6/2008 | Lauter et al. | |
| 7,761,772 B2 | 7/2010 | Dimou | |
| 8,010,873 B2 | 8/2011 | Kirschner et al. | |
| 2009/0006900 A1* | 1/2009 | Lastras-Montano et al. | ... 714/42 |
| 2009/0037782 A1* | 2/2009 | Hughes | ............ 714/53 |
| 2010/0332945 A1* | 12/2010 | Cypher | ......... 714/763 |
| 2012/0072786 A1* | 3/2012 | Bahali et al. | ........ 714/704 |
| 2012/0134216 A1* | 5/2012 | Singh | ........ 365/189.02 |
| 2012/0203980 A1* | 8/2012 | Flynn et al. | ........ 711/154 |

OTHER PUBLICATIONS

Saxena, N.; Chien Chen; Swami, R.; Osone, H.; Thusoo, S.; Lyon, D.; Chang, D.; Dharmaraj, A.; Patkar, N.; Lu, Y.; Chia, B.; , "Error detection and handling in a superscalar, speculative out-of-order execution processor system," Fault-Tolerant Computing, 1995. FTCS-25. Digest of Papers., Twenty-Fifth International Symposium on , vol., no., pp. 464-447.*

(Continued)

*Primary Examiner* — Cynthia Britt
(74) *Attorney, Agent, or Firm* — Park, Vaughan, Fleming & Dowler LLP

(57) ABSTRACT

A system for detecting an address or data error in a memory system. During operation, the system stores a data block to an address by: calculating a hash of the address; using the calculated hash and data bits from the data block to compute ECC check bits; and storing the data block containing the data bits and the ECC check bits at the address. During a subsequent retrieval operation, the memory system uses the address to retrieve the data block containing the data bits and ECC check bits. Next, the system calculates a hash of the address and uses the calculated hash and the data bits to compute ECC check bits. Finally, the system compares the computed ECC check bits with the retrieved ECC check bits to determine whether an error exists in the address or data bits, or if a data corruption indicator is set.

17 Claims, 6 Drawing Sheets

(56) References Cited

OTHER PUBLICATIONS

Meixner, A.; Bauer, M.E.; Sorin, D.J.; , "Argus: Low-Cost, Comprehensive Error Detection in Simple Cores," Microarchitecture, 2007. MICRO 2007. 40th Annual IEEE/ACM International Symposium on, vol., no., pp. 210-222, Dec. 1-5, 2007.*

Ruirui Huang, "IVEC: Off-Chip Memory Integrity Protection for Both Security and Reliability", ISCA' 10, Jun. 19-23, 2010.

Brian T. Gold, "Mitigating Multi-bit Soft Errors in L1 Caches Using Last-Store Prediction".

Jangwoo Kim, "Multi-bit Error Tolerant Caches Using Two-Dimensional Error Coding", Proceedings of the 40th Annual ACM/IEEE International Symposium on Microarchitecture (MICRO-40).

"DRAM Error Correcting Code", Oracle Proprietary/Confidential, pp. 9-117 thru 9-151.

"What is ECC Memory", http://pc-level.com/2012/04/what-is-ecc-memory/.

* cited by examiner

USING A DATA ECC TO DETECT ADDRESS CORRUPTION

BACKGROUND

1. Field

The present invention generally relates to error-detection and error-correction techniques for computer memories. More specifically, the present invention relates to a computer memory system that uses an error-correcting code for a data block to additionally detect corruption of an address associated with the data block.

2. Related Art

Computer systems routinely use error-detecting and error-correcting codes to detect and/or correct various data errors which are caused, for example, by noisy communication channels and unreliable storage media. Some error-detecting and error-correcting codes, such as single-error correction, double-error detection (SECDED) Hamming codes, can be used to correct single-bit errors and detect double-bit errors. Other codes, which are based on Galois fields, can be used to correct a special class of multi-bit errors caused by a failure of an entire memory component. (For example, see U.S. Pat. No. 7,188,296, entitled "ECC for Component Failures Using Galois Fields," by inventor Robert E. Cypher, filed 30 Oct. 2003, referred to as "the '296 patent.")

Although such memory systems go to great lengths to detect and correct "data" errors, they typically do little or nothing to detect "address" errors which can arise when an address is communicated to a memory device during a memory operation. For example, such address errors can be caused by noisy communication channels, or timing problems that occur when latching an address in a temporary register while the address is in transit to the memory. Such address errors can be just as problematic as data errors, because address errors can cause a data block to be read from and/or written to the wrong memory address.

Hence, what is needed is a method and an apparatus for using error-correcting codes to detect such address errors.

SUMMARY

The disclosed embodiments provide a system for detecting an address or data error in a memory system. During operation, the memory system writes a data block to an address. In doing so, the system first calculates a hash of the address and uses the calculated hash and the data bits to compute error-correcting code (ECC) check bits for the data block. Next, the system writes the data block to a location specified by the address in memory, wherein the data block includes the data bits and the ECC check bits. During this writing process transmission errors can cause the address and or the data to be corrupted. A data error causes erroneous data to the written to the location specified by the address, whereas an address error causes the data to be written to an erroneous location. (Note that the dominant cause of data errors is "soft errors" in the memory itself, typically caused by cosmic rays. This is why the system uses an error correcting code for data errors. Hence, even when the correct data is written, the data can be corrupted when subsequently read.) The memory system can also read the data block. This involves using the address to retrieve the data block containing the data bits and associated ECC check bits. Next, the system calculates a hash of the address and uses the calculated hash and the data bits to compute ECC check bits. Finally, the system compares the computed ECC check bits with the retrieved ECC check bits to determine whether an error exists in the address or data bits.

In some embodiments, computing the ECC check bits involves using a "not-data indicator" (possibly along with the hash of the address bits) to compute the ECC check bits, wherein the not-data indicator indicates whether an uncorrectable error has previously been detected in the data block. (Note that this uncorrectable error may be detected at any location in the computer system, not just within the memory system.)

In some embodiments, when the system subsequently consumes a data block with an asserted not-data indicator, the system initiates a trap.

In some embodiments, calculating the hash of the address involves calculating a parity bit for the address. In other embodiments, calculating the hash of the address involves calculating a CRC for the address.

In some embodiments, the data block is a cache line.

In some embodiments, each data block in the memory system includes an array of bits logically organized into R rows and C columns, wherein each column is stored in a different memory component. Two of the columns comprise ECC check bits including a row-checkbit column containing row-parity bits for each of the R rows, and an inner-checkbit column containing X=R−S inner checkbits and S spare bits. The C−2 remaining columns are data-bit columns containing data bits. Moreover, the checkbits are generated from the data bits to provide guaranteed detection and probabilistic correction for a failed memory component. For example, see U.S. patent application Ser. No. 12/782,580 (the '580 application), entitled "Memory System that Supports Probabilistic Component-Failure Correction with Partial-Component Sparing," by inventors Bharat K. Daga and Robert E. Cypher, filed 18 May 2010, which is hereby incorporated by reference. In a variation on the above-described embodiment where S=0, the system provides guaranteed correction in addition to guaranteed detection for a failed memory component. For example, see U.S. patent application Ser. No. 12/785,633 (the '633 application), entitled "Memory System that Provides Guaranteed Component-Failure Correction with Double-Error Correction," by inventors Bharat K. Daga and Robert E. Cypher, filed 24 May 2010, which is hereby incorporated by reference.

In some embodiments, the row-parity bit column contains a row-parity bit for each of the R rows in the block. In contrast, the inner-checkbit column contains X=R−S inner checkbits which are defined to cover bits in the array in accordance with a set of check vectors, wherein each check vector is associated with a different bit in the array and is an element of a Galois field ($GF(2^X)$). The check vectors are derived from a set of keys that are unique elements of $GF(2^X)$, wherein each key is associated with a different column of the array, and the check vector for a row r of a column c is the product in $GF(2^X)$ of the key for the column c and $\alpha^r$, wherein $\alpha$ is a primitive element of $GF(2^X)$. Also, each key in the set of keys is an element of a subfield of $GF(2^X)$, wherein the subfield does not contain any $\alpha^i$, where $1 \leq i < R$. Note that the column keys have to be appropriately chosen to support the ECC scheme as is described in the '580 application (referenced above).

In some embodiments, the ECC is a single-error correcting, double-error detecting (SECDED) code, such as a Hamming code. Note that if the ECC is a SECDED code, including an multi-bit address hash is less flexible than a single-bit hash (e.g., parity bit). With a single-bit hash, the system could use an unused "correctable" syndrome to store the hash value. Moreover, if there are n unused "correctable" syndromes, the system could support a hash mapping to up to n different values, assigning each value a different syndrome.

DETAILED DESCRIPTION

Figure 1:
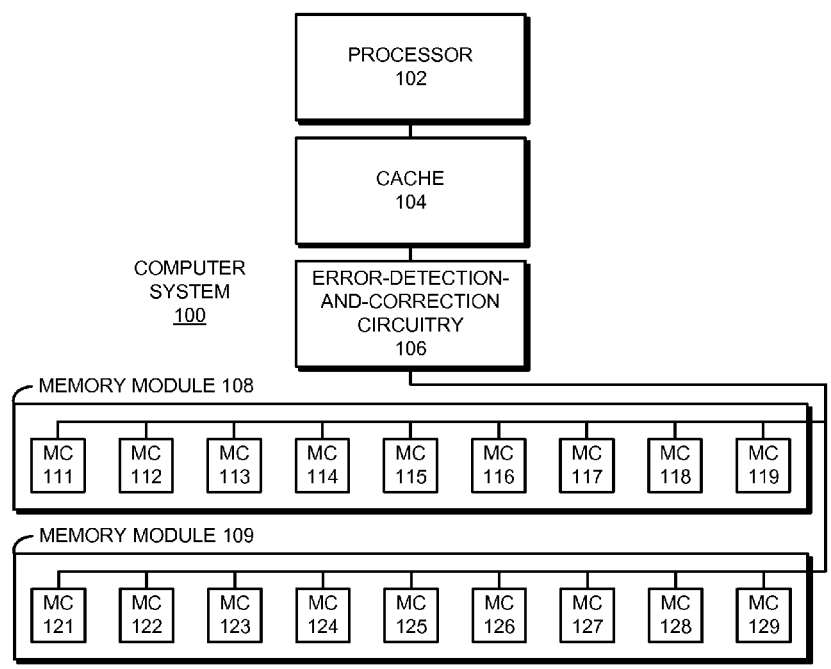
FIG. 1 illustrates a computer system in accordance with an embodiment of the present invention.

The following description is presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the disclosed embodiments. Thus, the disclosed embodiments are not limited to the embodiments shown, but are to be accorded the widest scope consistent with the principles and features disclosed herein.

The data structures and code described in this detailed description are typically stored on a non-transitory computer-readable storage medium, which may be any device or medium that can store code and/or data for use by a computer system. The non-transitory computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing code and/or data now known or later developed.

The methods and processes described in the detailed description section can be embodied as code and/or data, which can be stored in a non-transitory computer-readable storage medium as described above. When a computer system reads and executes the code and/or data stored on the non-transitory computer-readable storage medium, the computer system performs the methods and processes embodied as data structures and code and stored within the non-transitory computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Overview

The described embodiments relate a memory system that uses error-correcting codes to detect address errors in addition to detecting and correcting data errors. This is accomplished by incorporating a hash of the address into the error-correcting code for a data block before the data block is written to memory. When the data block is subsequently read from memory, this error-correcting code enables the system to determine (with some probability) whether the address used to read the data block is the same as the address previously used to write the data block to memory.

If not, the system signals that an address error has occurred. This address error can arise because: (1) the address was corrupted during the read operation which caused the wrong data block to be read from memory; or (2) the read operation was correct, but an error took place during a preceding write operation that caused the wrong data block to be written to the address. Note that address errors that occur during write operations are not detectable until the data block is subsequently read from the memory location corresponding to the corrupted address. Moreover, such address errors can be systematically detected during periodic "memory scrubbing" operations, during which the memory controller systematically scans through memory to detect and correct correctable errors before further corruption renders them uncorrectable.

Before describing these error-correcting codes, we first describe a memory system that uses these techniques.

Computer System

FIG. 1 illustrates a computer system 100 in accordance with an embodiment of the present invention. Computer system 100 can generally include any type of computer system, including, but not limited to, a computer system based on a microprocessor, a mainframe computer, a digital signal processor, a portable computing device, a personal organizer, a cell phone, a device controller, or a computational engine within an appliance. Computer system 100 includes at least one processor 102, a cache memory 104, error-detection-and-correction circuitry 106 and memory modules 108 and 109. Processor 102 can include any type of computational engine that executes code and manipulates data. Cache memory 104 can include one or more caches or levels of caches, which store blocks of data (cache lines) that have recently been accessed or are likely to be accessed in the near future.

Error-detection-and-correction circuitry 106 includes circuitry that performs error-correction and error-detection operations for blocks of data retrieved from memory modules 108-109 and which are stored in cache memory 104. Error-correction and error-detection operations can additionally (or alternatively) be performed when blocks of data in cache memory 104 are accessed by processor 102 from cache memory 104. Moreover, error-detection-and-correction circuitry 106 also calculates the ECC check bits for data blocks which are to be written to memory. One embodiment of error-detection-and-correction circuitry 106 is described in the '296 patent referenced above.

Memory modules 108 and 109 include memory components, which can be semiconductor chips containing random-access memory. More specifically, memory module 108 includes memory components (MCs) 111-119 and memory module 109 includes MCs 121-129.

Block Structure

Figure 2:
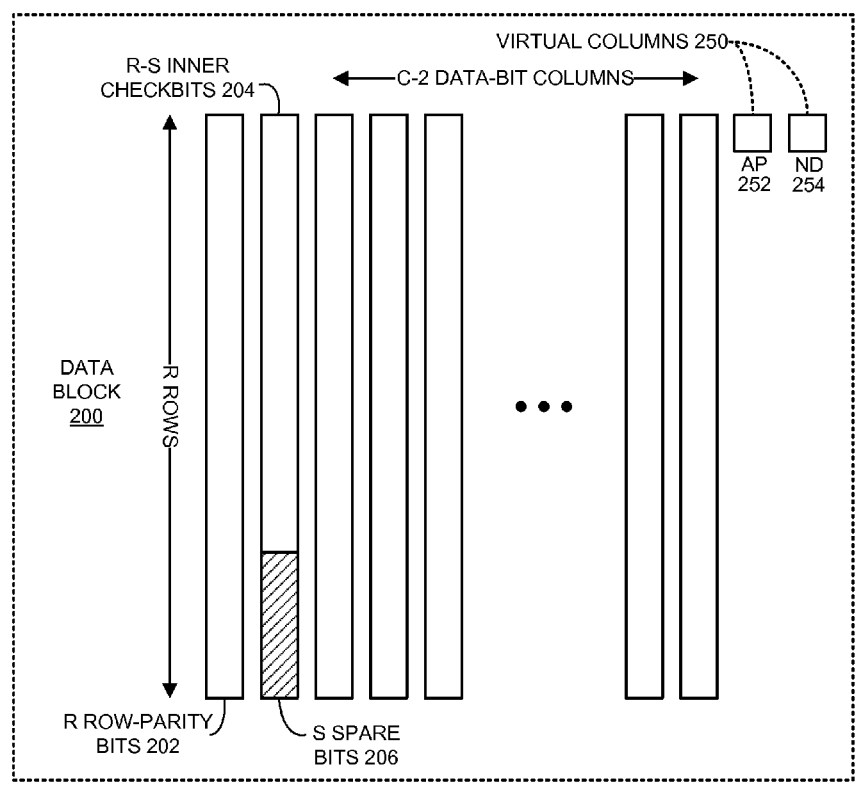
FIG. 2 illustrates a data block in accordance with an embodiment of the present invention.

FIG. 2 illustrates the structure of a data block 200 in an exemplary memory system, which contains a codeword for a code that facilitates error correction and error detection in accordance with an embodiment of the present invention. As mentioned above, data block 200 includes an array of bits logically organized into R rows and C columns. The C columns include (1) a row-checkbit column containing row-parity bits 202 for each of the R rows, (2) an inner-checkbit column containing R−S inner checkbits 204 and S spare bits 206, and (3) C−2 data-bit columns containing data bits. A specific embodiment of the present invention uses the parameters R=32, N=18, X=R−S=24, and S=8.

The system also includes two "virtual columns" 250, wherein a first of these virtual columns contains an address hash which in the illustrated embodiment comprises a single "address-parity bit" (AP) 252, and a second of these virtual columns contains a single "not-data bit" (ND) 254 (which is more generally referred to as a "not-data indicator"). Note that these virtual columns are not actually stored in memory, but are held in temporary storage and are only used to compute the row-parity bits 202 and the row-checkbits 204. Also note that the not-data bit 254 can alternatively reside in the same virtual column as the address hash (assuming that the address hash is less than R bits in length).

Address-parity bit 252 can be computed by performing an address-parity operation over the address associated with data block 200. Note that instead of address-parity bit 252, the system can generally use any hash of the address, wherein the hash is stored in the first virtual column.

Not-data bit 254 is used to indicate that an uncorrectable error has previously been detected in the data block and that the data in the block is invalid. If the system consumes a data block and the ECC circuitry determines that this not-data bit is set, the system knows that the data block has been corrupted. In this case, should the processor attempt to consume the corrupted data, the system can initiate a trap operation to deal with the corrupted data block as is described in more detail below with reference to FIG. 6.

Note that each of the C−2 columns in data block 200 is stored in a different memory component, and the checkbits are generated from the data bits to provide block-level detection and correction for a failed memory component. The row-checkbit column contains a row-parity bit for each of the R rows in the block. In contrast, the inner-checkbit column contains inner checkbits which are defined to cover bits in the array in accordance with a set of check vectors, wherein each check vector is associated with a different bit in the array and is an element of a Galois field $GF(2^X)$, wherein X=R−S. These check vectors are derived from a set of keys that are unique elements of $GF(2^X)$, wherein each key is associated with a different column of the array. The check vector for a row r of a column c is the product in $GF(2^X)$ of the key for the column c and $\alpha^r$, wherein $\alpha$ is a primitive element of $GF(2^X)$. Techniques for using these checkbits to provide component failure detection and correction are described a related pending non-provisional patent application (which is hereby incorporated herein by reference) by inventor Robert E. Cypher entitled, "Facilitating Probabilistic Error Detection and Correction after a Memory Component Failure," having Ser. No. 12/494,514 (the '514 application), and filing date 30 Jun. 2009.

In an exemplary embodiment, data block 200 comprises a cache line which has a total of 72 bytes, comprising 64 bytes of data and 8 bytes of ECC checkbits. These 72 bytes are stored in 18 dynamic random-access memory (DRAM) devices using four-bit wide dual in-line memory modules (DIMMs). In this embodiment, 32 bits (4 bytes) of data block 200 are stored in each DRAM device. The ECC codeword comprises the full cache line including the two columns of ECC checkbits. The ECC code structure comprises 18 columns corresponding to 18 DRAM devices. Each column has 32 rows which correspond to the 32 bits from each chip. In addition, there are two virtual columns which contain the address-parity bit 252 and a not-data bit 254.

Generating and Storing ECC Check Bits

Figure 3:
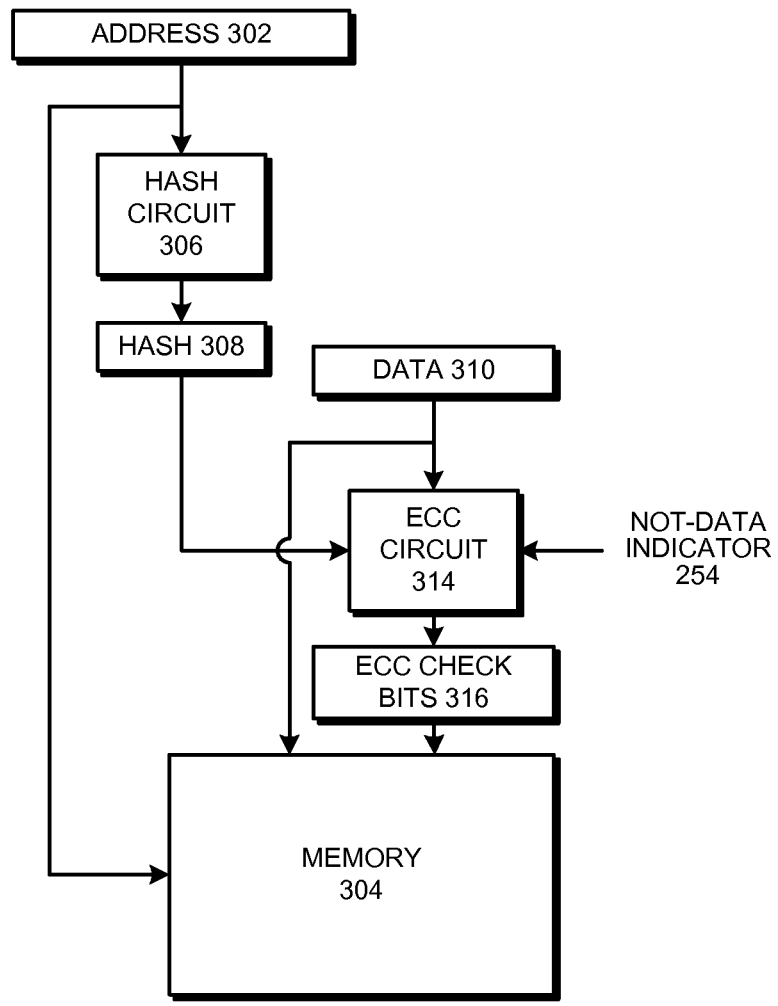
FIG. 3 illustrates circuitry to generate and store ECC check bits for a data block in accordance with the disclosed embodiments.

FIG. 3 illustrates circuitry to generate and store ECC check bits 316 for a data block in accordance with the disclosed embodiments. First, an address 302 for the data block feeds through a hash circuit 306 to produce a hash 308 for the address. Next, hash 308 feeds into ECC circuit 314 along with data 310 and a not-data indicator 254. ECC circuit 314 uses these inputs to produce the ECC check bits 316. Note that the not-data indicator 254 can comprise a "not-data bit" as is illustrated in FIG. 2. Next, address 302 is used to store the data 310 and the ECC check bits 316 to a location associated with address 302 in memory 304.

Incorporating the not-data indicator 254 and the address hash 308 into ECC check bits 316 provides a number of advantages. When the system subsequently accesses the associated data block, the system can use ECC check bits 316 to determine if there was an address error, and also if the data has been corrupted, for example by an uncorrectable error when the data block was previously accessed. Note that if the data being written is independent of the data previously read from that memory location, there is no need to set the not-data indicator even if there was an uncorrectable error when the memory location was previously read or the data previously read from that memory location was otherwise corrupted.

Figure 4:
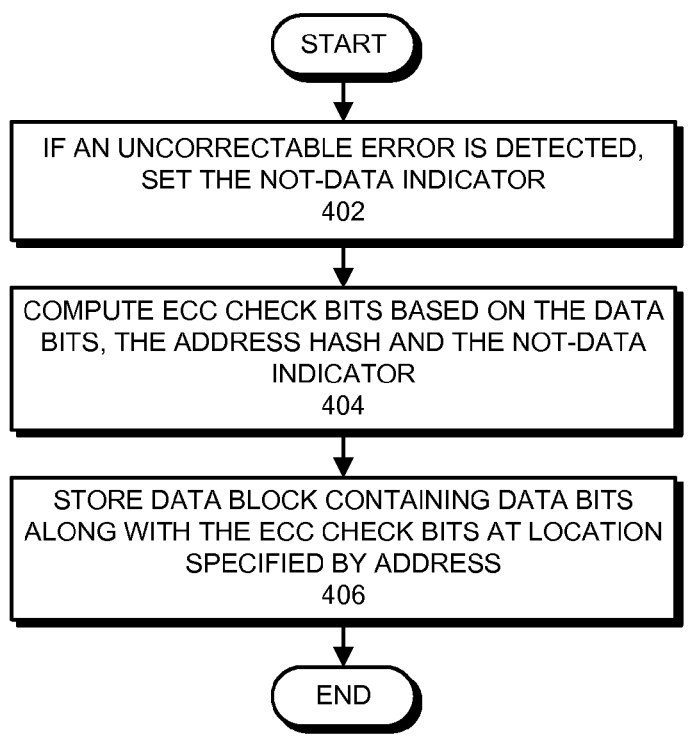
FIG. 4 presents a flow chart illustrating the process of generating and storing ECC check bits in accordance with the disclosed embodiments.

FIG. 4 presents a corresponding flow chart illustrating the process of generating and storing ECC check bits 316 for a data block in accordance with the disclosed embodiments. First, if the data has been corrupted, for example if a previous comparison between computed ECC check bits and retrieved ECC check bits indicated an uncorrectable error exists in a retrieved data block, the system sets the not-data indicator 254 (step 402). Next, the system computes ECC check bits 316 based on the data bits 310, the address hash 308 and the not-data indicator 254 (step 404). The system then stores a data block containing the data bits 310 and ECC check bits 316 at a memory location specified by the address 302 (step 406).

Retrieving and Checking ECC Check Bits

Figure 5:
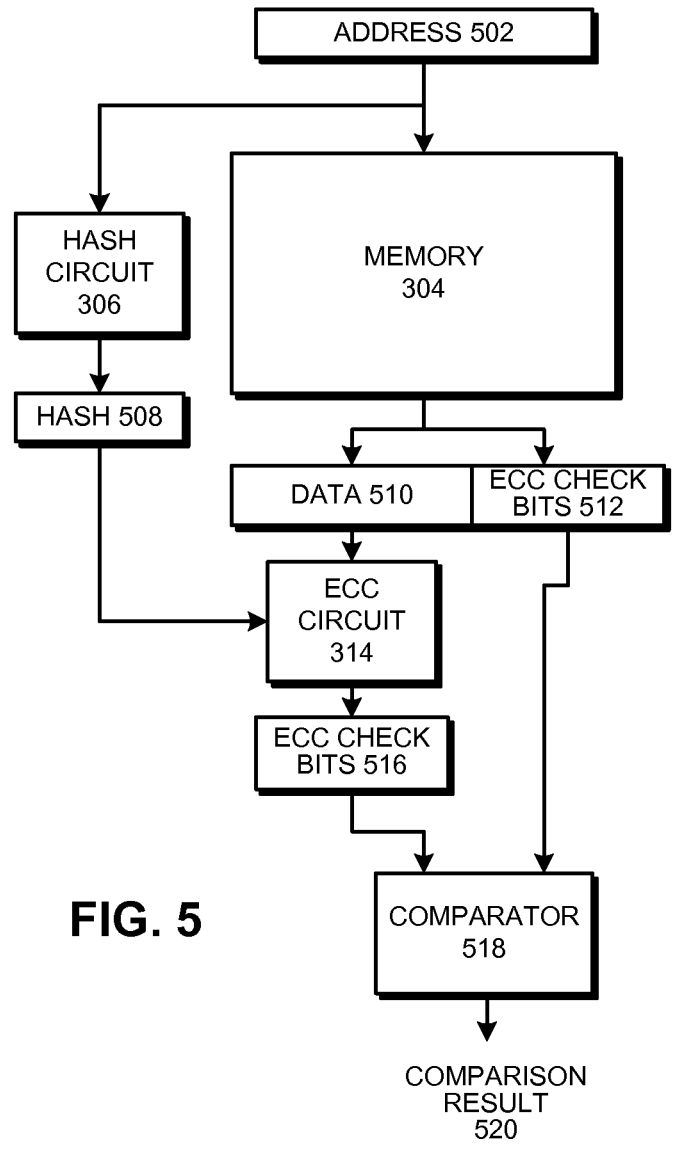
FIG. 5 illustrates circuitry to retrieve and check ECC check bits in accordance with the disclosed embodiments.

FIG. 5 illustrates circuitry to retrieve and check ECC check bits in accordance with the disclosed embodiments. During a memory operation, this circuitry uses an address 502 to retrieve a previously written data block. The retrieved data block includes data 510 and ECC check bits 512. Address 502 additionally feeds into a hash circuit 306 which computes a hash 508 of the address. In one embodiment, hash circuit 306 is an address-parity circuit and hash 508 comprises a single address-parity bit. In other embodiments, other hash functions can be used.

Next, the retrieved data 510 and hash 508 are fed into inputs of an ECC circuit 314 which computes ECC check bits 516 based on these inputs. The computed ECC check bits 516 is then compared with the retrieved ECC check bits 512 using comparator 518 to produce a comparison result 520. Note that comparison result 520 can indicate that: (1) no errors exist and the data block is correct; (2) a correctable error exists in the data block, in which case the system can correct the error; or (3) an uncorrectable error exists in the data block, in which case the system stores the data block back to memory with new ECC check bits that indicate that the data block is invalid.

Figure 6:
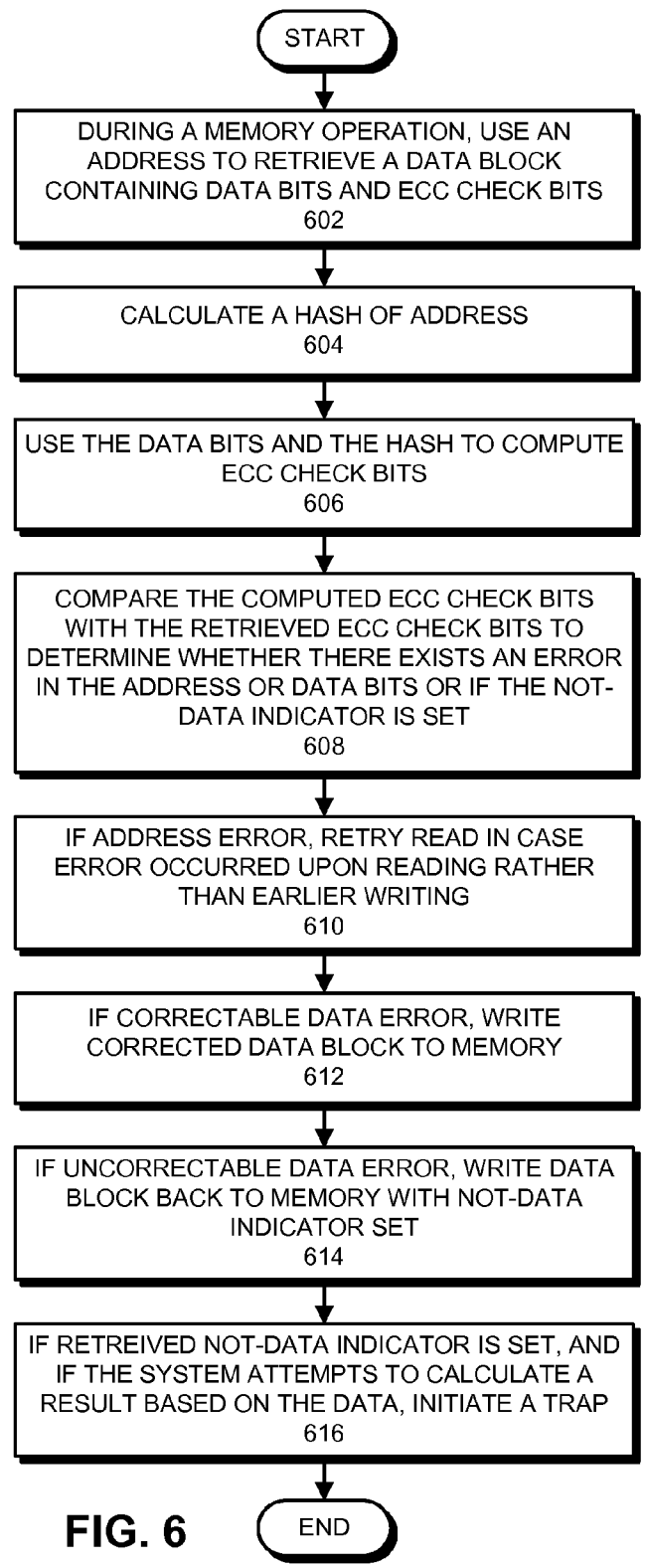
FIG. 6 presents a flow chart illustrating the process of retrieving and checking ECC check bits in accordance with the disclosed embodiments.

FIG. 6 presents a corresponding flow chart illustrating the process of retrieving and checking ECC check bits in accordance with the disclosed embodiments. First, during a memory operation, the system uses an address 502 to retrieve a data block containing data bits 510 and associated ECC check bits 512 (step 602). Next, the system calculates a hash 508 of the address 502 (step 604) and uses the calculated hash 508 and the data bits 510 to compute ECC check bits 516 (step 606). Finally, the system compares the computed ECC check bits 516 with the retrieved ECC check bits 512 to determine whether an error exists in the address or data bits and also whether the not-data indicator is set (step 608). As mentioned above, if the computed ECC check bits 516 match the retrieved ECC 512 check bits, there is no error and the not-data indicator is not set. Otherwise, if the computed ECC check bits 516 do not match the retrieved ECC check bits 512, the system can compare the retrieved ECC check bits 512 with the computed ECC check bits 516 to determine whether the error is a correctable data error, an address error, a set not-data indicator or an uncorrectable error.

In the case of an address error, the system can retry the read in case the corruption occurred upon reading rather than the earlier writing (step 610). In the case of a correctable data error, the corrected data can be written back to memory (step 612). Otherwise, in the case of an uncorrectable data error, the data block can be written back to memory having ECC check bits with the not-data indicator set (614). (Also the not-data indicator can be carried with the data to any consumption by the processor, so a trap can be initiated.)

Also, if the system determines in step 608 that the not-data indicator was previously set in the retrieved data block, and if the system attempts to consume the data, for example by calculating a result based on the associated data, the system can initiate a trap (step 616). This enables an associated trap-handler routine to take whatever action is necessary to deal with the uncorrectable error in the data block.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A method for detecting an address or data error in a memory system, comprising:
    during a memory operation, using an address to retrieve a data block containing data bits and associated error-correcting code (ECC) check bits;
    calculating a hash of the address, which involves calculating a parity bit for the address;
    using the calculated hash which includes the parity bit for the address, and the data bits to compute ECC check bits; and
    comparing the computed ECC check bits with the retrieved ECC check bits to determine whether an error exists in the address or data bits.

2. The method of claim 1, wherein prior to the memory operation the method further comprises storing the data block to the address by:
    calculating the hash of the address;
    using the calculated hash and data bits from the data block to compute the ECC check bits; and
    storing the data block containing the data bits and the ECC check bits at a location specified by the address.

3. The method of claim 2, wherein computing the ECC check bits involves using a "not-data indicator" with the data bits to compute the ECC check bits, wherein the not-data indicator indicates whether the data block has become corrupted.

4. The method of claim 1, wherein the data block is a cache line.

5. The method of claim 1, wherein each data block in the memory system includes an array of bits logically organized into R rows and C columns, wherein each column is stored in a different memory component, wherein two of the columns comprise ECC check bits including a row-checkbit column containing row-parity bits for each of the R rows, and an inner-checkbit column containing X=R−S inner checkbits and S spare bits, and wherein the C−2 remaining columns are data-bit columns containing data bits, and wherein the checkbits are generated from the data bits to provide guaranteed detection and probabilistic correction for a failed memory component.

6. The method of claim 1, wherein the ECC is a single-error correcting, double-error detecting (SECDED) code.

7. The method of claim 6, wherein the SECDED code is a Hamming code.

8. A memory system that facilitates detecting an address or data error, comprising:
    an access mechanism configured to access a data block from the memory system by using an address to retrieve the data block, wherein the data block contains data bits and associated error-correcting code (ECC) check bits;
    an error-checking mechanism configured to,
        calculate a hash of the address, which involves calculating a parity bit for the address;
        use the calculated hash which includes the parity bit for the address, and the data bits to compute ECC check bits; and
        compare the computed ECC check bits with the retrieved ECC check bits to determine whether an error exists in the address or data bits.

9. The memory system of claim 8, wherein the memory system is configured to store the data block to the address by:
    calculating the hash of the address;
    using the calculated hash and the data bits from the data block to compute the ECC check bits; and
    storing the data block containing the data bits and the ECC check bits at a location specified by the address.

10. The memory system of claim 9, wherein the memory system is configured to use a "not-data indicator" with the data bits to compute the ECC check bits, wherein the not-data indicator indicates whether the data block has become corrupted.

11. The memory system of claim 8, wherein the data block is a cache line.

12. The memory system of claim 8, wherein each data block in the memory system includes an array of bits logically organized into R rows and C columns, wherein each column is stored in a different memory component, wherein two of the columns comprise ECC check bits including a row-checkbit column containing row-parity bits for each of the R rows, and an inner-checkbit column containing X=R−S inner checkbits and S spare bits, and wherein the C−2 remaining columns are data-bit columns containing data bits, and wherein the checkbits are generated from the data bits to provide guaranteed detection and probabilistic correction for a failed memory component.

13. The memory system of claim 8, wherein the ECC is a single-error correcting, double-error detecting (SECDED) code.

14. The memory system of claim 13, wherein the SECDED code is a Hamming code.

15. A memory system that facilitates error detection, comprising:
    an access mechanism configured to use an address to access data blocks from the memory system, wherein each data block contains data bits and associated error-correcting code (ECC) check bits;
    wherein while storing a data block to the memory the access mechanism is configured to,
        calculate a hash of the address, which involves calculating a parity bit for the address;

use the calculated hash which includes the parity bit for the address, the data bits and a not-data indicator to compute ECC check bits, wherein the not-data indicator indicates whether the data block has become corrupted, and store the data block containing the data bits and the ECC check bits at a memory location specified by the address.

16. The memory system of claim 15, wherein while subsequently accessing the data block from the address, the memory system is configured to:

use the address to retrieve the data block containing data bits and the ECC check bits;

use the data bits and a not-data indicator to compute ECC check bits; and compare the computed ECC check bits with the retrieved ECC check bits to determine whether the not-data indicator is set, and if not whether an error exists in the data bits.

17. The memory system of claim 15, wherein the data block is a cache line.

* * * * *

UNITED STATES PATENT AND TRADEMARK OFFICE
CERTIFICATE OF CORRECTION

PATENT NO.         : 8,812,935 B2
APPLICATION NO.    : 13/565430
DATED              : August 19, 2014
INVENTOR(S)        : Loewenstein Page 1 of 1

It is certified that error appears in the above-identified patent and that said Letters Patent is hereby corrected as shown below:

In the Drawings

On sheet 6 of 6, in figure 6, under Box No. 616, line 1, delete "RETREIVED" and insert -- RETRIEVED --, therefor.

In the Specification

In column 1, line 52, delete "and or" and insert -- and/or --, therefor.

Signed and Sealed this
Tenth Day of March, 2015

Michelle K. Lee
*Deputy Director of the United States Patent and Trademark Office*